(12) United States Patent
Van Gemert et al.

(10) Patent No.: US 9,196,537 B2
(45) Date of Patent: Nov. 24, 2015

(54) PROTECTION OF A WAFER-LEVEL CHIP SCALE PACKAGE (WLCSP)

(71) Applicant: NXP B.V., Eindhoven (NL)

(72) Inventors: Leonardus Antonius Elisabeth Van Gemert, Nijmegen (NL); Hartmut Buenning, Norderstedt (DE); Tonny Kamphuis, Lent (NL); Sascha Moeller, Hamburg (DE); Christian Zenz, Graz (AT)

(73) Assignee: NXP B.V., Eindhoven (NL)

( * ) Notice: Subject to any disclaimer, the term of this patent is extended or adjusted under 35 U.S.C. 154(b) by 101 days.

(21) Appl. No.: 13/967,164

(22) Filed: Aug. 14, 2013

(65) Prior Publication Data

US 2014/0138855 A1    May 22, 2014

Related U.S. Application Data

(60) Provisional application No. 61/816,609, filed on Apr. 26, 2013, provisional application No. 61/727,204, filed on Nov. 16, 2012, provisional application No. 61/717,594, filed on Oct. 23, 2012.

(51) Int. Cl.

| | |
|---|---|
| *H01L 21/30* | (2006.01) |
| *H01L 21/46* | (2006.01) |
| *H01L 21/78* | (2006.01) |
| *H01L 21/301* | (2006.01) |
| *H01L 21/44* | (2006.01) |
| *H01L 21/48* | (2006.01) |

(Continued)

(52) U.S. Cl.
CPC ............ *H01L 21/782* (2013.01); *H01L 21/561* (2013.01); *H01L 23/3114* (2013.01); *H01L 21/568* (2013.01); *H01L 2224/16225* (2013.01); *H01L 2224/32225* (2013.01); *H01L 2224/73204* (2013.01); *H01L 2224/92125* (2013.01)

(58) Field of Classification Search
CPC . H01L 21/782; H01L 21/561; H01L 23/3114; H01L 2224/92125; H01L 2224/32225; H01L 2224/16225; H01L 2224/73204; H01L 21/568
USPC ............ 438/458, 459, 460, 462, 33, 68, 110, 438/113
See application file for complete search history.

(56) References Cited

U.S. PATENT DOCUMENTS

| | | |
|---|---|---|
| 4,039,371 A | 8/1977 | Brunner et al. |
| 6,338,980 B1 | 1/2002 | Satoh |

(Continued)

*Primary Examiner* — A. Sefer
*Assistant Examiner* — Dilinh Nguyen

(57) ABSTRACT

Consistent with an example embodiment, there is a method for assembling a wafer level chip scale processed (WLCSP) wafer; The wafer has a topside surface and an back-side surface, and a plurality of device die having electrical contacts on the topside surface. The method comprises back-grinding, to a thickness, the back-side surface the wafer. A protective layer of a thickness is molded onto the backside of the wafer. The wafer is mounted onto a sawing foil; along saw lanes of the plurality of device die, the wafer is sawed, the sawing occurring with a blade of a first kerf and to a depth of the thickness of the back-ground wafer. Again, the wafer is sawed along the saw lanes of the plurality of device die, the sawing occurring with a blade of a second kerf, the second kerf narrower than the first kerf, and sawing to a depth of the thickness of the protective layer. The plurality of device die are separated into individual device die. Each individual device die has a protective layer on the back-side, the protective layer having a stand-off distance from a vertical edge of the individual device die.

15 Claims, 16 Drawing Sheets

(51) Int. Cl.
    *H01L 21/50*     (2006.01)
    *H01L 21/782*     (2006.01)
    *H01L 23/31*     (2006.01)
    *H01L 21/56*     (2006.01)

(56) References Cited

U.S. PATENT DOCUMENTS

| | | |
|---|---|---|
| 7,682,874 B2 | 3/2010 | Xiaochun et al. |
| 2001/0016400 A1 | 8/2001 | Lee |
| 2002/0094601 A1 | 7/2002 | Su et al. |
| 2005/0073029 A1 | 4/2005 | Chua et al. |
| 2007/0026568 A1 | 2/2007 | Beyne |
| 2007/0045796 A1* | 3/2007 | Ye et al. .................. 257/678 |
| 2007/0139892 A1 | 6/2007 | Iigima et al. |
| 2007/0200209 A1 | 8/2007 | Fukuzono |
| 2008/0029859 A1 | 2/2008 | Do et al. |
| 2008/0179730 A1 | 7/2008 | O'Donnell et al. |
| 2008/0274603 A1 | 11/2008 | Do et al. |
| 2008/0305616 A1 | 12/2008 | Clawson |
| 2008/0315372 A1 | 12/2008 | Kuan et al. |
| 2009/0233395 A1 | 9/2009 | Pyo et al. |
| 2009/0309212 A1 | 12/2009 | Shim et al. |
| 2010/0047969 A1 | 2/2010 | Kim et al. |
| 2010/0144069 A1 | 6/2010 | Johnson |
| 2011/0101524 A1 | 5/2011 | Camacho et al. |
| 2011/0254156 A1 | 10/2011 | Lin |
| 2012/0049334 A1 | 3/2012 | Pagaila et al. |
| 2012/0061827 A1* | 3/2012 | Fujita .................. 257/737 |
| 2012/0171814 A1* | 7/2012 | Choi et al. .................. 438/107 |
| 2013/0075936 A1 | 3/2013 | Lin et al. |
| 2013/0108203 A1 | 5/2013 | Pariza et al. |
| 2014/0110826 A1 | 4/2014 | Buenning et al. |
| 2014/0138855 A1 | 5/2014 | Van Gemert et al. |

* cited by examiner

PROTECTION OF A WAFER-LEVEL CHIP SCALE PACKAGE (WLCSP)

CROSS-REFERENCE TO RELATED APPLICATIONS

This application claims the benefit of U.S. Patent Application Ser No. 61/816,609, filed Apr 26, 2013, and U.S. Patent Application Ser No. 61/727,204, filed Nov 16, 2012, the contents of which are incorporated by reference herein. Further, this application claims the benefit of U.S. Pat Application Ser No. 61/717,594, filed on Oct 23, 2012.

FIELD

The embodiments of the present invention relate to semiconductor device packaging and, more particularly, to WLCSP packaging having modifications that protect the semiconductor die from handling damage so as to enhance the manufacturability and quality of products.

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

The packaging of an IC device is increasingly playing a role in its ultimate performance. For example, in mobile devices (i.e., mobile phones, tablet computers, laptop computers, remote controls, etc), WLCSP components are used in their assembly. WLCSP components save valuable space in the mobile device. After assembly, in some example processes, customers encapsulate these WLCSP devices by injection molding or casing. This manual post-processing of the bare WLCSP may result in device damage; generally, handling of the WLCSP devices should be minimized.

There is a need for a WLCSP assembly process which can address the challenges raised by the needs of mobile applications.

SUMMARY

The present disclosure has been found useful in the packaging of semi-conductor devices which find their way into portable electronic devices. In particular, WLCSP products which are furnished as unpackaged die to manufacturers of mobile devices, who in turn encapsulate these devices directly onto a printed circuit board (in an effort to conserve valuable space in the mobile device) may subject these unpackaged die to rough handling. The handling may result in cracking or other latent damage which may not show up until the mobile device reaches the end user. Consequently, the customer may prefer to have the WLCSP product surrounded by non-brittle material, which prevents damage to the die itself, before receiving the product for assembly in to his mobile device.

The user applies a protective material on the back-side of a wafer having device die. The active device die are separated by sawing. Through processing the unpackaged die are protected on their backside surfaces with a protective material which absorbs the shocks of manual handling during assembly of the mobile device. The process can also be used for chip-scale packaging (CSP) with or without solder balls.

In an example embodiment, there is a method for assembling a wafer level chip scale processed (WLCSP) wafer, the wafer having a front-side surface and a back-side surface, a plurality of device die having electrical contacts on the front-side surface. The method comprises back-grinding, to a thickness, the back-side surface the wafer. A protective layer of a thickness is applied onto the back-side surface of the wafer. The wafer is mounted onto a sawing foil onto the back-side surface having the protective layer. The wafer is sawed in saw lanes of the plurality of device die on the front-side surface, the sawing occurring with a blade of a first kerf and to a first depth of the back-ground wafer thickness; again, the wafer is sawed along the saw lanes of the plurality of device die, the sawing occurring with a blade of a second kerf, the second kerf narrower than the first kerf, and sawing to a depth of the thickness of the protective layer. The plurality of device die are separated into individual device die. Each individual device die has a protective layer on the back-side, the protective layer having a stand-off distance from a vertical edge of the individual device die.

In another example embodiment, a semiconductor device, having a front-side surface and an back-side surface, the semiconductor device of a thickness, the semiconductor device comprises an active device of an area defined on the front-side surface, the front-side surface having a first area. A protective material is on to the backside surface of the semiconductor device, the protective material having an area greater than first area. A stand-off distance of the combination of the protective material and of laminating film is a function of the semiconductor device thickness and the tangent of an angle of tooling impact upon a vertical side surface the semiconductor device. A feature of this embodiment includes a laminating material of the same area as that of the protective material; the laminating material is sandwiched between the back-side surface and an underside surface of the protective material.

In an example embodiment, there is a method for assembling a wafer level chip scale processed (WLCSP) wafer, the wafer having a front-side surface and a back-side surface, a plurality of device die having electrical contacts on the front-side surface. The method comprises, mounting the wafer onto a grinding foil; back-grinding, to a thickness, the back-side surface the wafer, performing a half-cut sawing on the back-side surface of the wafer in areas corresponding to saw lanes of the plurality of device die, forming slots surrounding each one of the plurality of device die, the slots having a width of the half-cut blade kerf and a depth of about 50% of the thickness of the back-ground wafer. A protective layer of a thickness is molded onto the back-side of wafer, the protective layer filling in the slots and covering the back-side surface. The WLCSP wafer is mounted on its back-side surface, onto a sawing foil. The method further comprises, sawing the WLCSP wafer on the front-side surface in saw lanes of the plurality of device die, the sawing occurring with a blade of a first kerf and to at least a first depth of the back-ground wafer, the first kerf less than that of the half-cut blade kerf; and again sawing the WLCSP on the front-side surface in the saw lanes of the plurality of device die, the sawing occurring with a blade of a second kerf, the second kerf narrower than the first kerf, and sawing to a depth of at least the thickness of the protective layer. The plurality of device die are separated into individual device die. Each individual device die has a protective layer on the back-side, the vertical edges having recesses formed from the slots, the protective layer filling the recesses flush with the vertical edges and the protective layer has a stand-off distance from vertical edges of the individual device die.

In another example embodiment, a method for assembling a wafer level chip scale processed (WLCSP) wafer, the wafer having a front-side surface and a back-side surface, a plurality of device die having electrical contacts on the front-side surface, comprises, mounting the wafer onto a grinding foil, back-grinding, to a thickness, the back-side surface the wafer. The method further comprises, performing a half-cut sawing on the back-side surface of the wafer in areas corresponding to saw lanes of the plurality of device die, forming slots surrounding each one of the plurality of device die, the slots having a width of the half-cut blade kerf and a depth of about 50% of the thickness of the back-ground wafer. A protective layer of a thickness is molded onto the back-side surface of wafer, the protective layer filling in the slots and covering the back-side surface. The WLCSP wafer is mounted on its back-side surface, onto a sawing foil. The WLCSP wafer is sawed on the front-side surface in saw lanes of the plurality of device die, the sawing occurring with a blade of a first kerf and to at least a total thickness of the back-ground wafer and thickness of the protective layer, the first kerf less than that of the half-cut blade kerf. Stretching the sawing foil and separating the plurality of device die yield individual device die. Each individual device die has a protective layer on the back-side, the vertical edges having recesses formed from the slots, the protective layer filling the recesses flush with the vertical edges and the protective layer is about flush with the vertical edges of the individual device die.

In an example embodiment, there is a method for assembling a wafer level chip scale processed (WLCSP) wafer, the wafer having a front-side surface and a back-side surface, a plurality of device die having electrical contacts on the front-side surface, the method comprises mounting the wafer onto a grinding foil. The back-side surface the wafer undergoes back-grinding to a thickness. Onto a first-side surface, the wafer is mounted onto a sawing foil. Through a second-side surface, the wafer is sawed through to a depth of the back-ground thickness of the wafer, in areas corresponding to saw lanes of the plurality of device die; the second-side surface is opposite the first-side surface. So as to space apart device die, the sawing foil is stretched. The wafer, onto its front-side surface, is re-mounted onto molding foil; the sawing foil is removed. The device die are enveloped in molding compound on the back-side surfaces and vertical faces of the spaced-apart device die, the molding compound of a thickness on the back-side surface and another thickness on the vertical faces. The molding foil is removed and the molded WLCSP wafer re-mounted on its back-side surface, onto a sawing foil. The molded WLCSP wafer is sawed on the front-side surface in saw lanes of the plurality of device die so as to separate the molded wafer into individual device die having protective molding thereon.

In another example embodiment, a method for assembling a wafer level chip scale processed (WLCSP) wafer, the wafer having a front-side surface and a back-side surface, a plurality of device die, having electrical contacts, on the front-side surface, comprises, mounting the wafer onto a grinding foil; back-grinding, to a thickness, the back-side surface the wafer. The method further comprises, mounting the wafer onto a sawing foil on the back-side surface, sawing the WLCSP wafer in saw lanes of the plurality of device die on the front-side surface, the sawing occurring with a blade of a first kerf and to a first depth of about 50% the back-ground wafer thickness, and again sawing the WLCSP along the saw lanes of the plurality of device die, the sawing occurring with a blade of a second kerf, the second kerf narrower than the first kerf, and sawing to a depth of about 90% to about 95% thickness of the back-ground wafer thickness. After sawing, the sawing foil is stretched so as to cleave apart the wafer and space apart device die, now having expanded saw lanes, resulting in vertical faces having overhangs thereon. On its front-side, the wafer is re-mounted onto molding foil and removing the sawing foil. With a molding compound, the device die are enveloped in the molding compound on the back-side surfaces and vertical faces of the spaced-apart device die, the molding compound of a thickness on the back-side surface and another thickness on the vertical faces, the overhangs providing enhanced anchoring of the molding compound. The molding foil is removed and the molded WLCSP wafer is re-mounted, on its backside, onto a sawing foil. In the expanded saw lanes, of the plurality of device die, on the front-side surface, the molded WLCSP is sawed so as to separate the molded wafer into individual device die having protective molding thereon.

In an example embodiment, there is a semiconductor device, with an active device having a front-side surface and a backside surface, the semiconductor device of an overall thickness. The semiconductor device comprises an active device with circuitry defined on the front-side surface, the front-side surface having an area; wherein in the back-side of the active device has recesses of a partial depth of the active device thickness and a width of about the partial depth, the recesses surrounding the active device at vertical edges. There is a protective layer of a thickness on to the backside surface of the active device, the protective material having an area greater than the first area and having a stand-off distance; wherein, the vertical edges have the protective layer filling the recesses flush with the vertical edges; and wherein a stand-off distance of the protective material is a function of the semiconductor device thickness and the tangent of an angle of tooling impact upon a vertical face the semiconductor device.

The above summaries of are not intended to represent each disclosed embodiment, or every aspect, of the present disclosure. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which:

FIG. 2A illustrates the handling of the example device;

FIG. 2B illustrates the placement of the example device onto a printed circuit board;

FIG. 2C illustrates the soldering of the example device, having an option under-fill, onto the printed circuit board;

Figure 1:
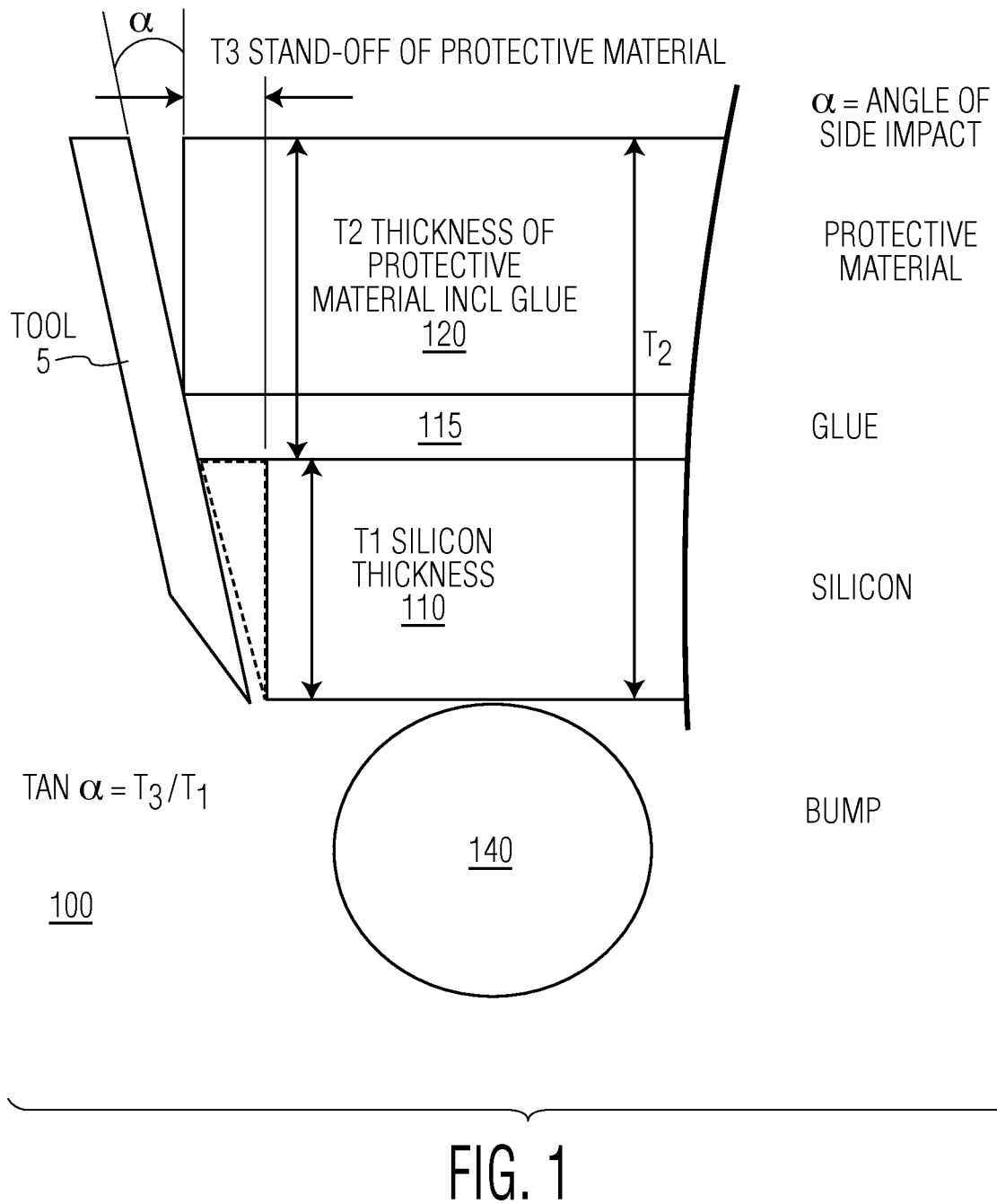
FIG. 1 illustrates the degree of stand-off of protective material with respect to angle of handling tool impact.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in preventing damage to the Wafer Level Chip-Scale Product (WLCSP) devices during their assembly. The process provides mechanical protection to the silicon device by mounting the device onto a protective material larger than the device die dimensions; the protective material forms a boundary on the device underside that keeps assembly tooling from directly contacting the silicon device, thus avoiding chipping and other damage. Such a process may be integrated into the customary back-end assembly.

Refer to FIG. 1. In an example embodiment, an assembly 100 includes an silicon device 110 of a thickness $T_1$. A protection angle α and a silicon thickness $T_1$ define the stand-off distance $T_3$ of the protection material. For example, to protect a device die of thickness, $T_1$=150 μm, against an impact by a tool 5 with a 20 degree impact angle, a stand-off of about 55 μm is appropriate. Generalized, the stand-off distance is:

$$T_3 = \tan \alpha T_1 \qquad (1)$$

The total thickness, $T_4$ of the protective material 120 and glue 115 is determined by materials used. The amount of standoff would be achieved by the differences between the "thick" blade and "thin" blade. For example, a pre-grinding thickness, $T_0$ of an eight-inch wafer (20.32 cm) is about 725 μm, for a six-inch wafer (15.24 cm). Note that this technique may be applied to wafer substrates of any size and may be useful for twelve-inch (30.48 cm) substrates. Further, devices using balls, bumps, pads, etc. benefit from the protective material. For the purposes of discussion, however, the examples that follow may use solder bumps. However, the techniques described are not limited to solder bumps. In an example process, a WLCSP is ground to a thickness of about 400 μm with a solder bump height of about 200 μm. It is desirable to achieve a minimum wafer thickness, $T_1$; however, it may be limited by the technical ability to thin down wafers with 200 μm bumps. Thickness, $T_1$ in an example process may be in the range of about 150 μm to about 250 μm. Alternatively, over-molding of the thin wafer can be before the solder bump application step. In that case the silicon wafer can be thinned down to silicon-thickness below 50 μm. $T_2$ is the total thickness of the protective material 120, $T_4$, glue 115, if any used, and silicon thickness $T_1$. Further, in some example processes, the thickness ($T_4$) of the protection layer is at least 100 μm. The protective material 120 laminated with glue 115, to the backside of the silicon 110 may be plastic or metal. The plastic material may be made of, but not necessarily limited to, KAPTON®, PTFE (polytetrafluoroethylene), molding compound, etc. KAPTON is the brand name of the polyimide film (i.e., poly-oxydiphenylene-pyromellitimide) manufactured by the E.I. du Pont de Nemours and Company. The protective material 120 and glue 115 used for the lamination must withstand a temperature range of about 200° C. to 300° C. usually encountered in the reflow process for WLCSP device assembly. Other flexible protective materials may include, but not necessarily limited to, polytetra-fluoroethylene. Some molding compounds, may include, but not necessarily limited to, those manufactured by Sumitomo (e.g.: x84194) and Hitachi (e.g.: cel 400 ZHF 40 53 C), etc.

In an example embodiment, an assembled WLCSP device may have a total thickness in the range of about 360 μm to about 400 μm (excluding solder bumps). The thicker the laminating material, the greater the side-wall protection of the silicon device die. If the silicon die thickness can be reduced to about 30 μm to about 50 μm, the laminating material would be about 350 μm to about 370 μm (at a 400 μm thickness, if the glue is included). The thickness reduction of the silicon is governed by the capability of the back-grinding process and the ability to handle the "Si-protection layer sawing" in the solder bumping flow.

Figure 2A:
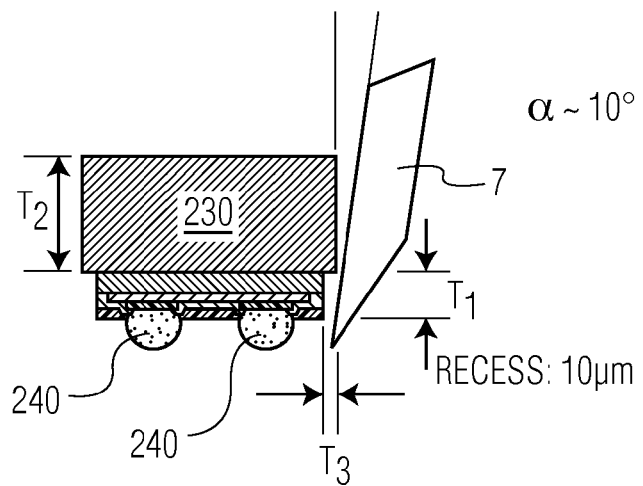
FIGS. 2A-2C illustrate an example device with protective material according to an embodiment of the present disclosure.
Figure 2B:
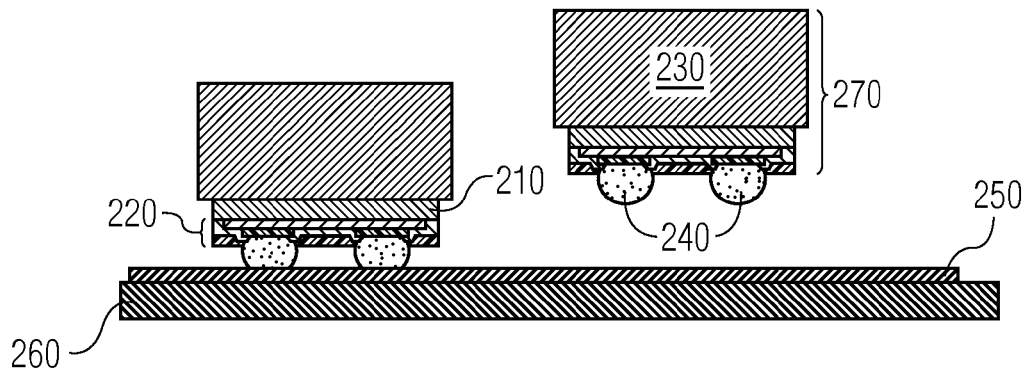
Figure 2C:
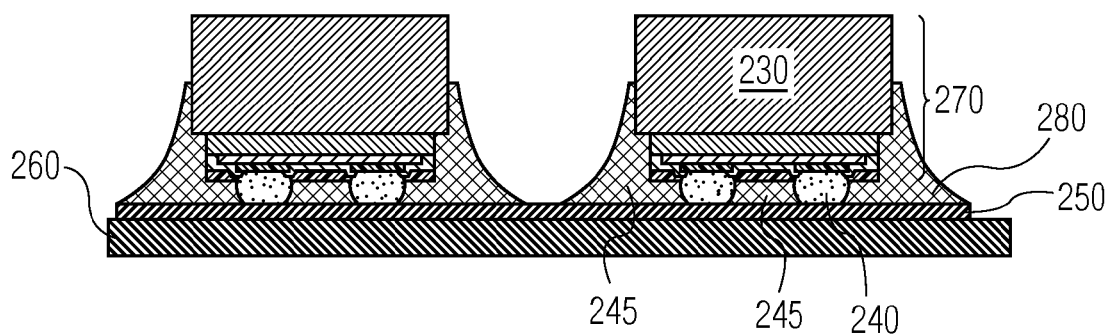

Refer to FIG. 2A. In another example embodiment, the WLCSP structure 220 may be, as thin as about 50 μm ($T_1$) and a recess stand-off ($T_3$) of about 10 μm with an angle α of about 10°. A thick protection layer 230 ($T_4$ of >150 μm) applied to the wafer backside 210 provides ample protection against mechanical damage owing to tools, tweezers, vacuum wands, etc. Refer to FIGS. 2B-2C. The protected device structure 220 is mounted to a surface 250 of an example printed circuit substrate 260. Tooling 7 to mount the device structure 220 onto the printed circuit substrate 260 no longer can damage the device structure 220. Through an optional solder under-fill 280, the device structure 270 is well-protected.

Figure 4A:
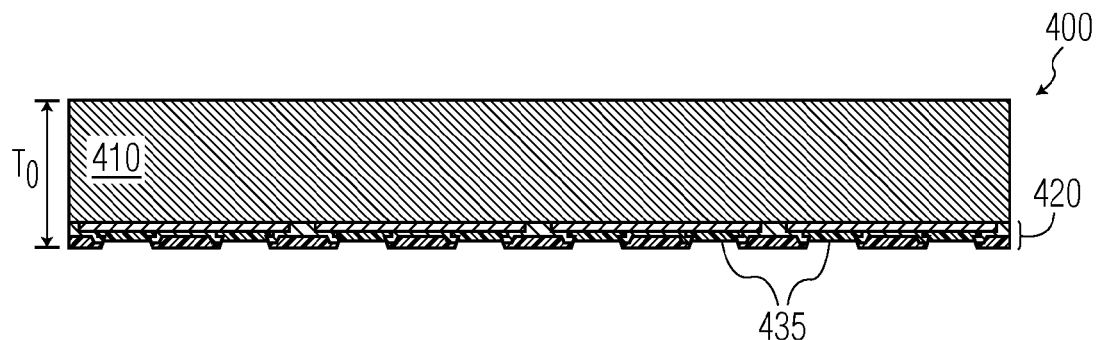
FIGS. 4A-4G illustrate in cross-section of example WLCSP device assembled by the process of FIG. 3.
Figure 4B:
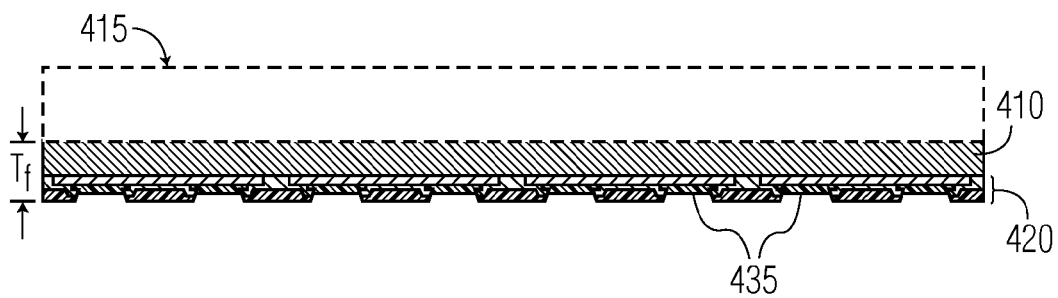
Figure 4C:
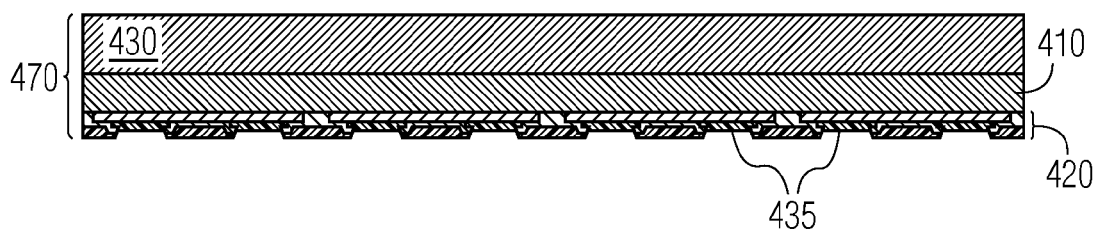
Figure 4D:
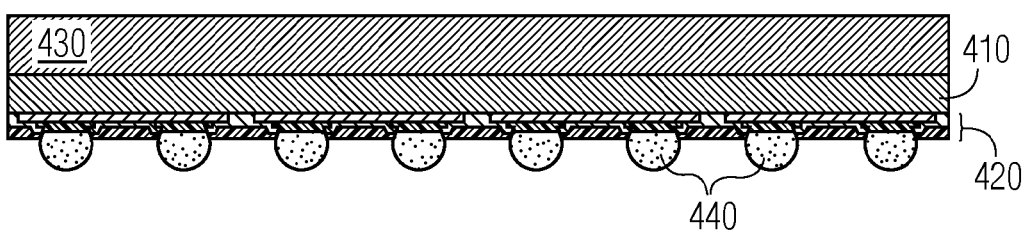

Refer to FIGS. 4A-4B. A silicon substrate 400 has an initial thickness $T_0$. Active devices 420 sit on a top surface of a substrate 410. The substrate 410 is back-ground to a thinner thickness $T_f$. In an example embodiment, the $T_f$ is about 100 μm. Dashed lines 415 show the amount of substrate material ground off. Regions 435 of electrical contacts will receive solder bumps or other electrical contact types. Refer to FIGS. 4C-4D. A protective coating of 430 may be applied through lamination of FIG. 2 or may be over-molded onto the thinned backside 410. Solder bumps 440 are defined in the electrical contacts 435.

The protective layer may be applied by over-molding of the thinned wafer. In case of a stiff material as protective layer e.g. a metal shield, a bonding processes using an adhesive can be used. More flexible protective layers e.g. KAPTON foils can be laminated to the Silicon wafers using a pre-applied adhesive on the foil or alternatively an adhesive on the Si—wafer. The metal shield may be stainless steel, copper, silver, gold, or other alloys, but not necessarily limited to these; the choice of metal is governed by cost constraints and process parameters.

Figure 3:
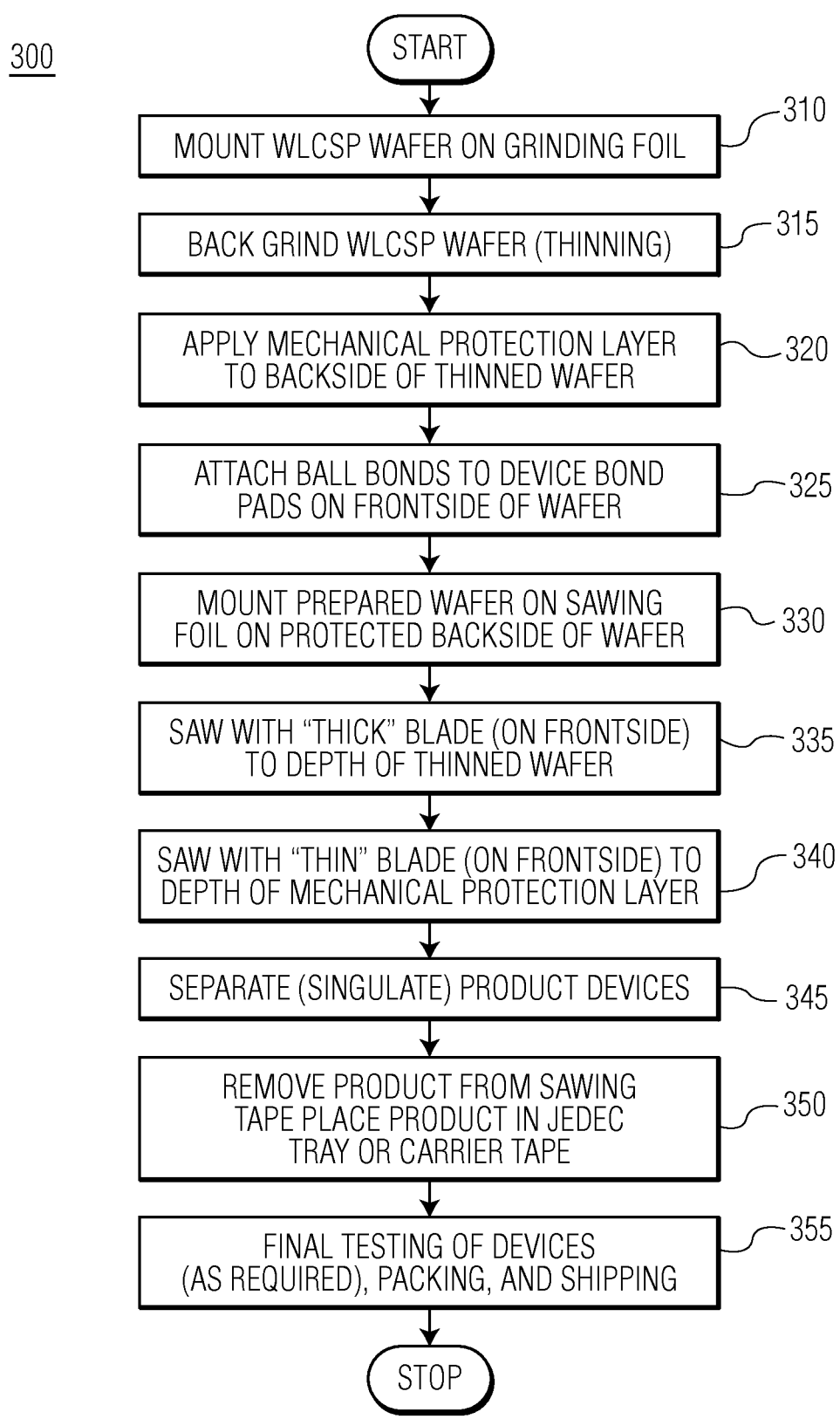
FIG. 3 is a flow diagram of an assembly process according to an embodiment of the present disclosure.

Refer to FIG. 3. In an example embodiment according to the present disclosure, a WLCSP wafer is mounted (front-side down) on a grinding foil 310. The WLCSP wafer is thinned down by back-grinding 315. A mechanical protection layer of a thickness is applied to the back-side of the thinned wafer 320. On the front-side of the wafer, solder bumps are attached to active device pads 325. The prepared wafer is mounted on sawing foiled on the now-protected back-side 330. With a saw blade of first kerf (e.g., a "thick blade"), the wafer is sawed through the front-side to a depth of the thinned wafer 335. With a saw blade of the second kerf (e.g., a "thin blade"), the wafer is further sawed to the depth of the mechanical protection layer 340. The product devices are separated (e.g., "singulated") 345. The product device die are removed from the sawing tape and placed in trays or mounted onto carrier tape 350. As, required, additional electrical testing may be performed; devices are packed and shipped to the end user 355.

Refer to FIGS. 4A-4D. A wafer substrate 410, having an initial thickness $T_0$, has been thinned by back-grinding 415. A mechanical protection layer 430 has been applied thereon. The front-side of the wafer substrate 410 has active devices 420. Device pads 435 have solder balls 440 attached on them.

Figure 4E:
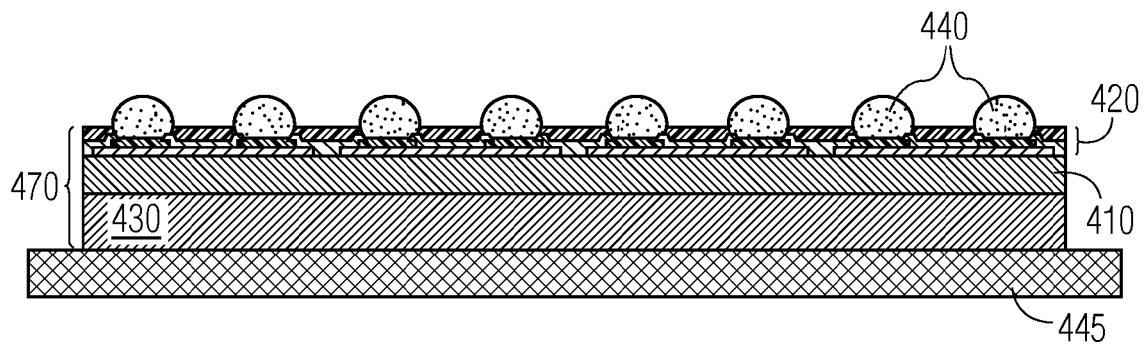
Figure 4F:
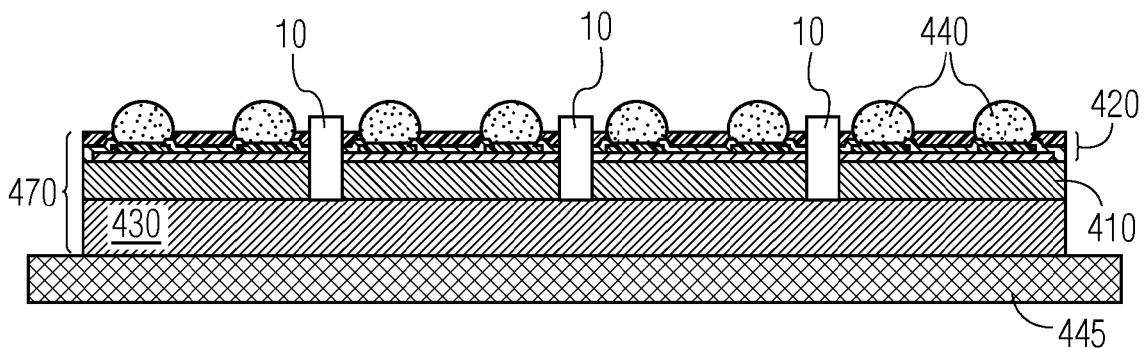
Figure 4G:
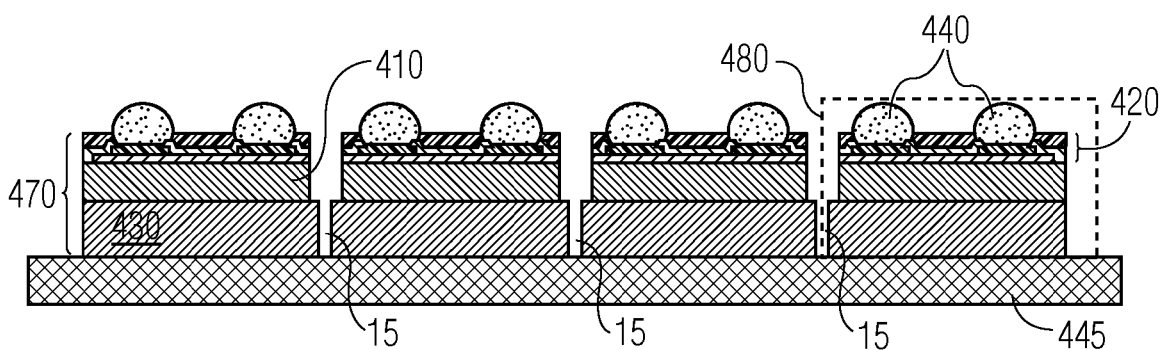

Refer to FIGS. 4E to 4G. The wafer assembly 470, having had the protective coating 430 applied, is attached to a sawing film 445. A first saw blade 10 of a given "kerf" (e.g., 50 μm) slices through between each active device 425 to a depth of the thinned out silicon substrate $T_f$. A second saw blade 15 of a narrower kerf (e.g., 30 μm) than that of the first saw blade 10 slices through the depth of the protective layer 430 to the top surface of the sawing film 445. The wafer assembly 470 now consists of separate device die 480. The separate device die 480 are removed from the sawing tape 445 for subsequent processing. Depending upon degree of stand-off required, the second blade may be adjusted higher or lower. Width of the first "kerf" can be increased by increasing the width of the saw lane (i.e., the distance between adjacent ICs on the wafer). Blades for conventional sawing are available for thicknesses greater the 300 μm; alternatively other etching processes can be used which are unlimited in terms of width. For the second "kerf," also alternative techniques can be used such as e.g. ablative laser which results in a kerf width of less than 15 μm.

Figure 5:
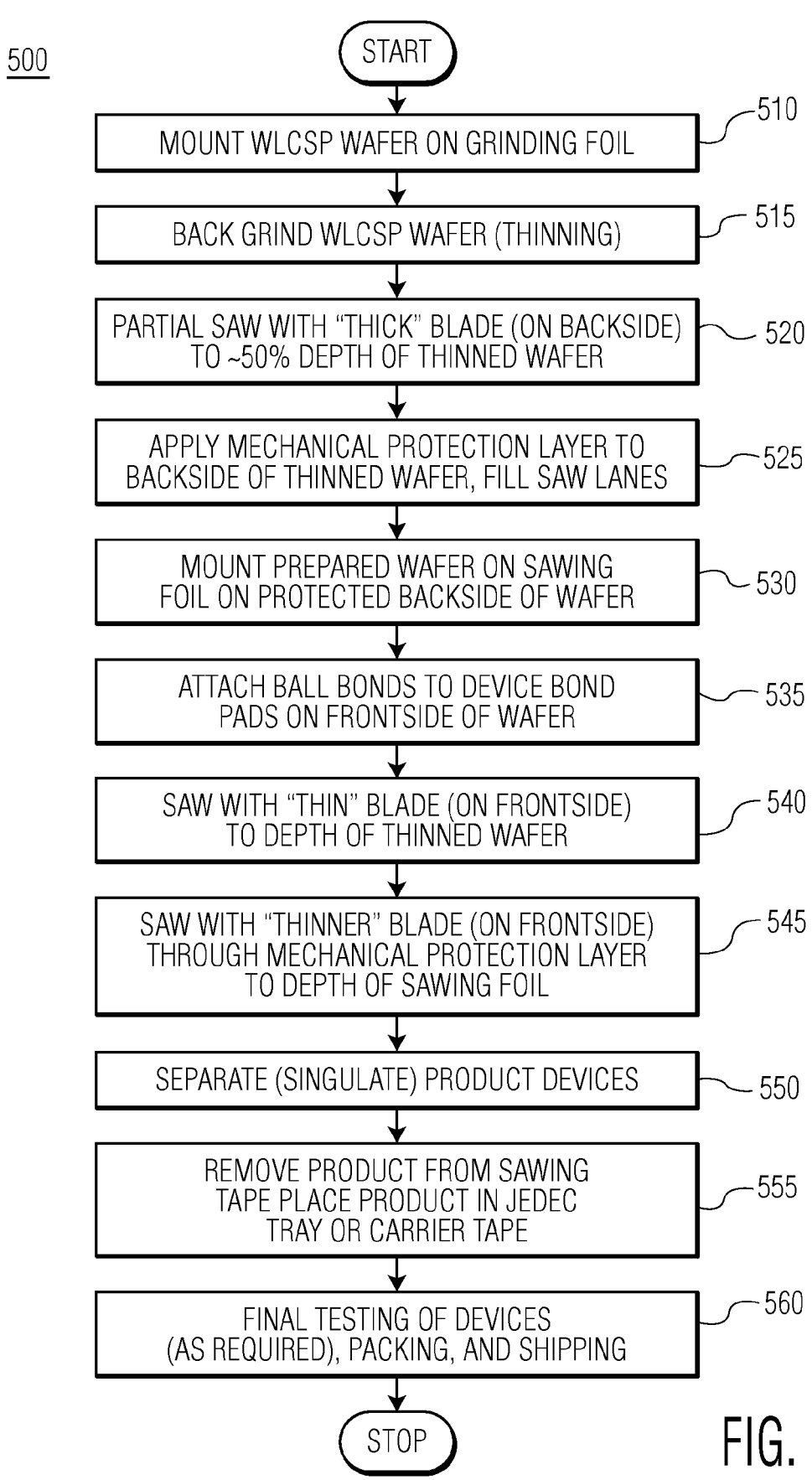
FIG. 5 is a flow diagram of an assembly process according to another embodiment of the present disclosure.

Refer to FIG. 5. In an example process according to the present disclosure, a WLCSP wafer is mounted onto a grinding foil 510. The WLCSP wafer is thinned with back-grinding 515. In the areas corresponding to saw lanes between individual device die, the back-side of the wafer is partially sawed (with a "thick" blade, of a first kerf) to a depth of about 50% of the thinned wafer thickness 520. A mechanical protection layer is applied to the back-side of the wafer 525; the saw lanes cut are filled in with the mechanical protection layer, as well. The correct positions of the saw lanes between individual devices may be ascertained through modern imaging techniques. For example, an infrared (IR) camera may be used in that silcon substrates are transparent to short-wave infrared light and thus, the features therein may be observed. The prepared wafer is mounted on its protected back-side surface onto a sawing foil 530. Solder bumps are attached to device bond pads on the front-side of the wafer 535. On the front-side of the wafer, the wafer is sawed 545 with a "thin" blade of a second kerf in the corresponding saw locations of the partial sawing 540; the depth of the second sawing 545 is that of the thinned wafer. Product devices are separated (i.e., "singulated") 550. Product is removed from the sawing tape 555 and put into appropriate trays or on carrier tape. If desired by the end-user, additional product testing may be done prior to packing and shipping 560.

Figure 6A:
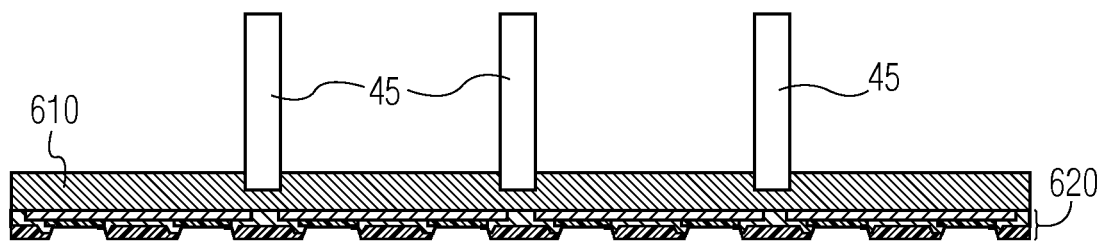
FIGS. 6A-6G illustrate in cross-section an example embodiment assembled by the process of FIG. 5.
Figure 6B:
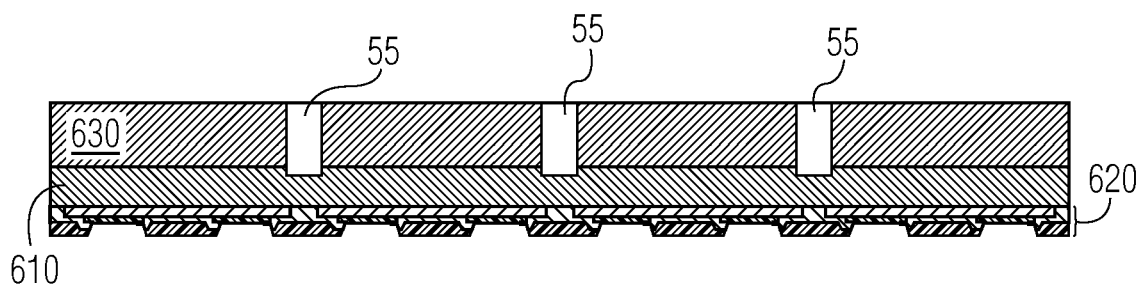
Figure 6C:
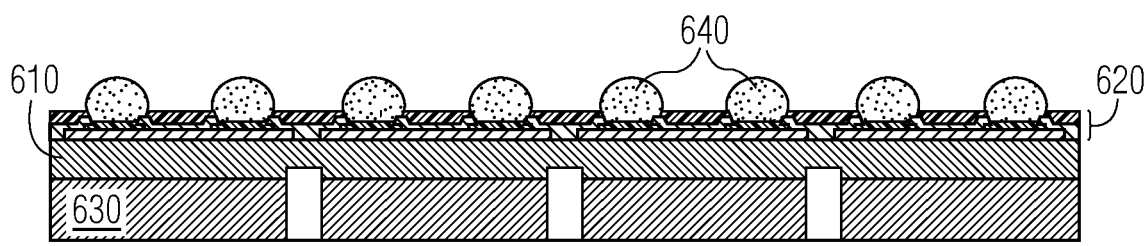
Figure 6D:
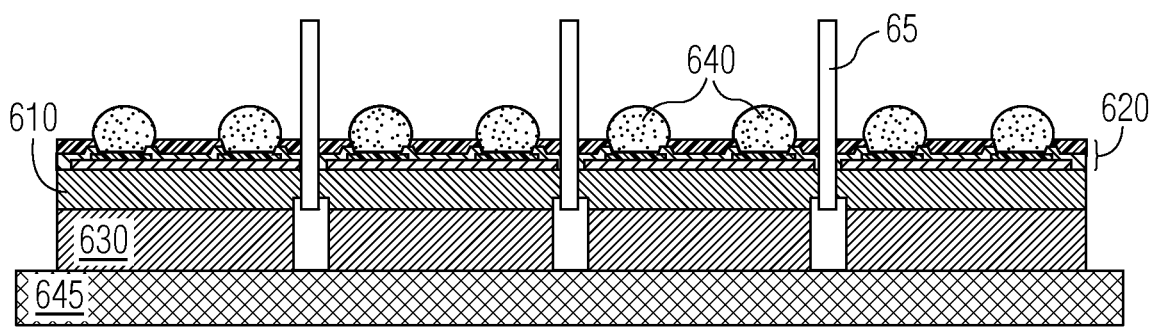
Figure 6E:
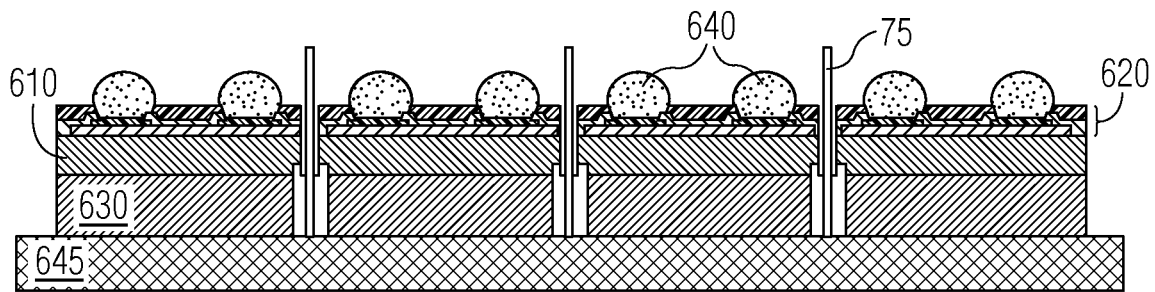
Figure 6F:
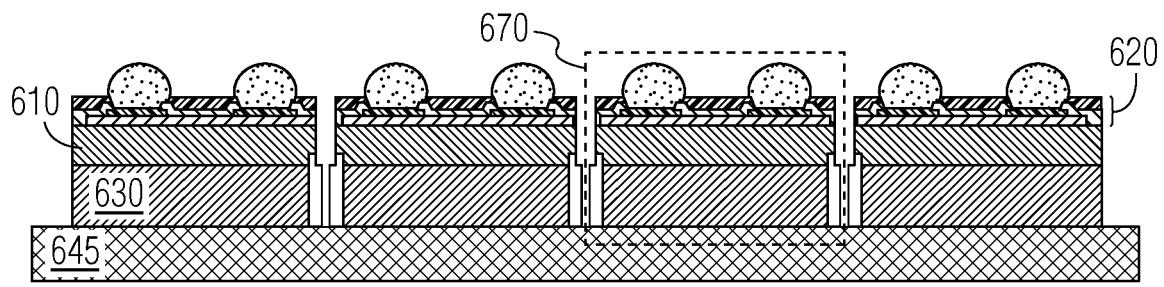

Refer to FIGS. 6A to 6B. In another example embodiment, a silicon wafer 610 having active device features 620, is partly cut from the backside prior to the attachment of the protective layer 630 along the saw lanes to a certain depth $T_{\text{half cut}}$. The "half-cut" 45 can be achieved by conventional blade dicing and any other appropriate techniques such as etching or ablative laser technologies. Further processing, according to the process similar to those discussed with FIGS. 4E-4G, is shown in FIGS. 6C-6F. In an example process, with the wafer placed on a sawing foil 645, the solder bumps 640 are attached to the contact areas 635 of the active device features 620. With a thick kerf saw blade 65 (a first blade), the wafer is sawn to at least a depth of the wafer thickness and half-cut 55 thickness; a production process would want to assure that the thin kerf blade cuts greater than the wafer thickness less than half-cut 55 thickness so as not to leave exposed side faces of silicon. Refer to FIGS. 6E-6F. With a thin kerf saw blade 75 (a subsequent or second blade), the cut is continued to the depth of the mechanical protective layer 630 until the sawing foil 645 is reached. After the subsequent sawing, the devices are separated into individual devices 610.

Figure 6G:
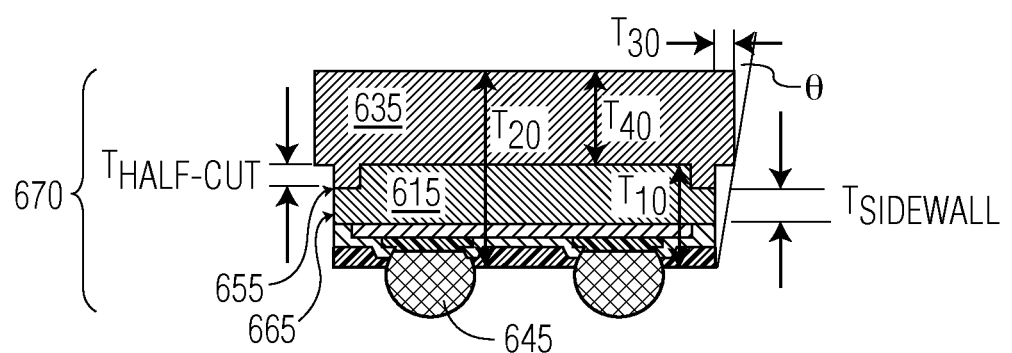

Refer to FIG. 6G. Note that the vertical faces of the silicon 615 are protected by a half-cut region 655 of protective layer 635; further this half-cut region 655 has additional over-hang 665 of protective layer 635. The area of the unprotected silicon side faces is further reduced.

As was illustrated in FIG. 1, FIG. 6G further depicts (the corresponding features) of device thickness $T_{10}$, The sum of the device thickness, $T_{10}$ and protective layer thickness $T_{40}$, results in an overall molded device thickness, $T_{20}$. A standoff angle θ is defined by a standoff distance $T_{30}$. The sidewall thickness of the device die is the difference between the device die thickness, $T_{10}$ and the depth of the "half-cut," $T_{\textit{Half-Cut}}$.

Figure 7:
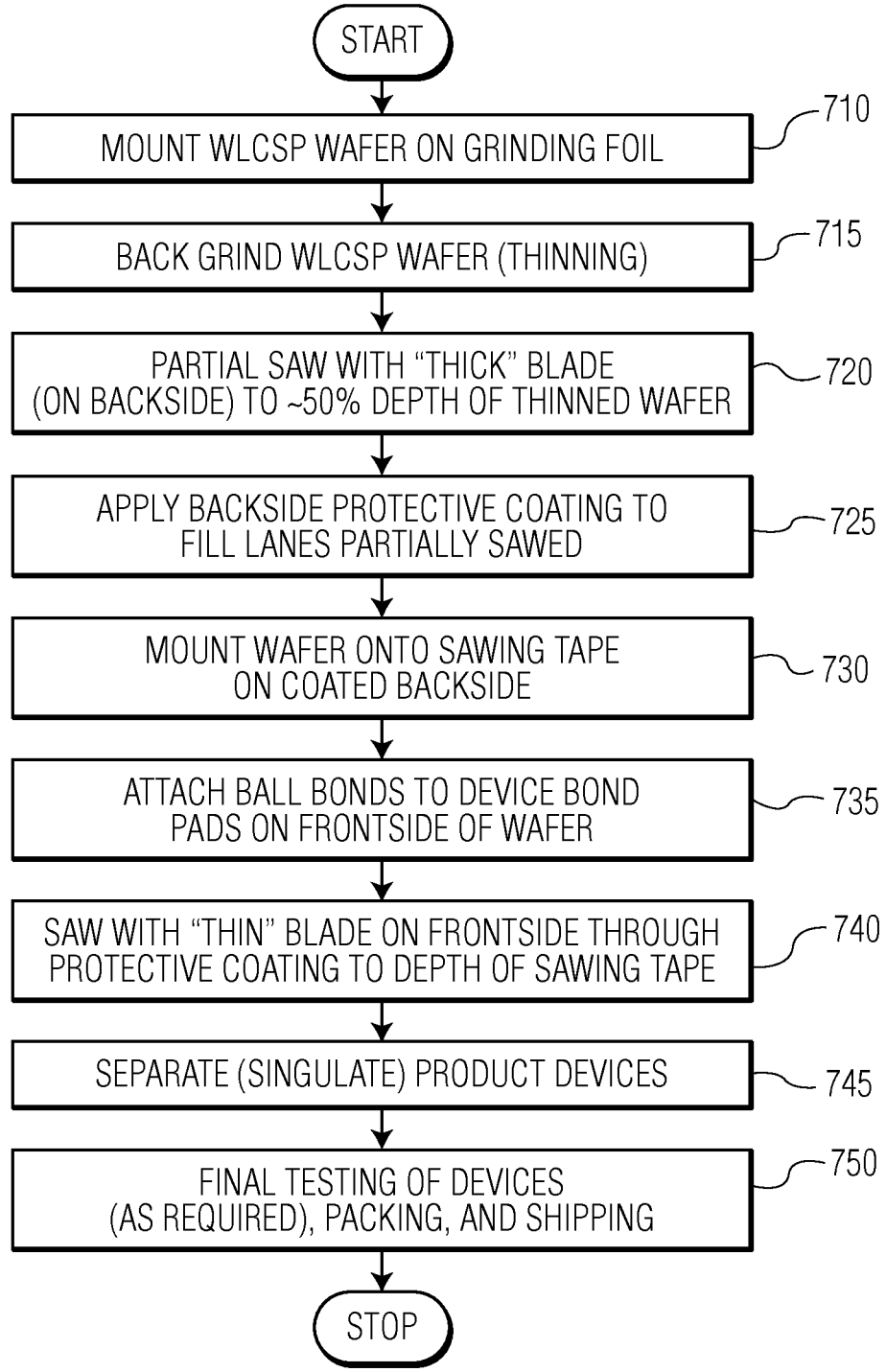
FIG. 7 is a flow diagram of an assembly process according to another embodiment of the present disclosure.

Refer to FIG. 7. In another example embodiment according to the disclosure, a WLCSP is mounted onto a grinding foil 710. The WLCSP wafer is thinned on its back-side by back grinding 715. The wafer is partially sawed with a "thick" blade on the back-side to a depth of about 50% of the thinned wafer. A back-side protective coating is applied so as to fill the saw lanes 725. The coated wafer is mounted on the coated side onto a sawing tape 730. On the front-side of the wafer, solder bumps are attached to device bond pads 735. With a "thin" blade from the front-side of the wafer, the wafer is sawed in the corresponding locations of the partial sawing 740; the depth of the sawing is the thinned wafer thickness plus the protective coating thickness. Product devices are separated 745. As per end user, the device may undergo further electrical test prior to packing and shipping 750.

Figure 8A:
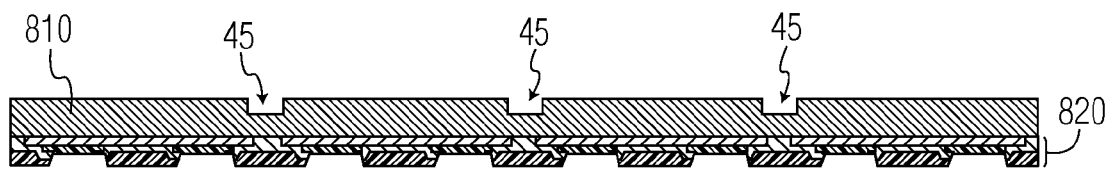
FIGS. 8A-8E illustrate in cross-section an example embodiment assembled by the process of FIG. 7.
Figure 8B:
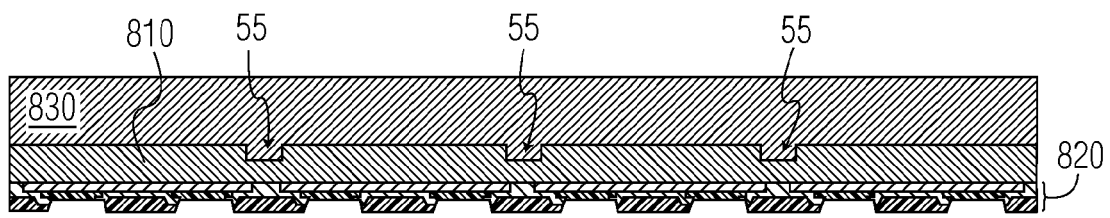
Figure 8C:
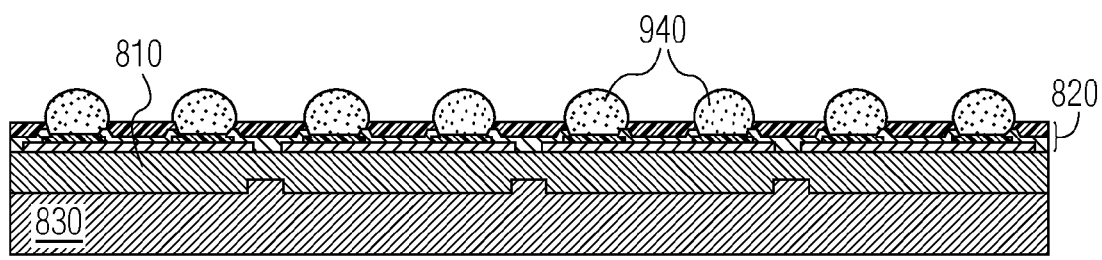
Figure 8D:
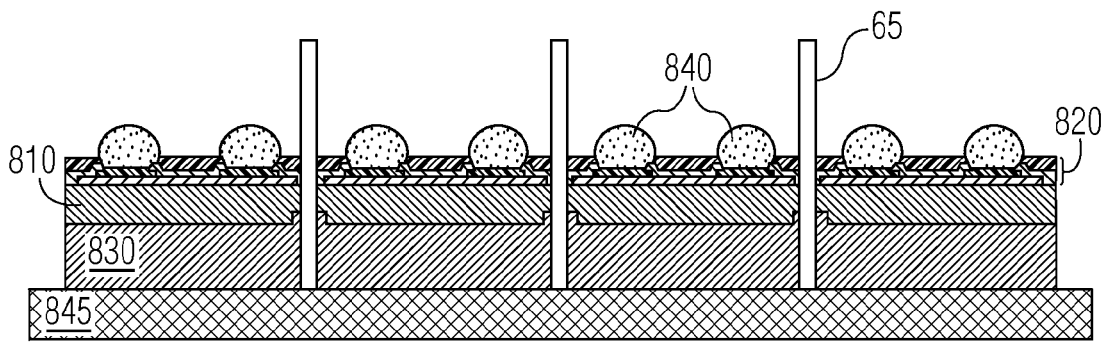
Figure 8E:
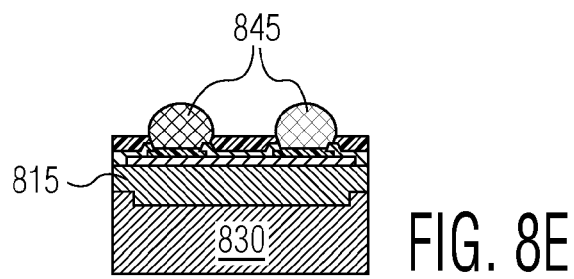

Refer to FIGS. 8A-8E. Background wafer substrate 810 having active device die 810 undergoes a partial sawing 45 (with a blade having a first kerf) on its back-side surface. A molding compound 830 is applied and flows into the partial saw cuts 45. On the front-side surface at device die pads, balls 840 are attached. The wafer substrate is mounted on a sawing tape 845. From the front-side of wafer substrate 810, a second sawing 65 is done with a narrower kerf blade than that used for the first partial sawing 45. After sawing, the wafer is separated in to individual devices as shown in FIG. 8E. The back-side of the device die 815 is protected by molding compound 835.

In an example process, depending upon the end user requirements, the wafer substrate may either undergo a single cut prior to applying the protective molding compound or a step-cut process which results in a step profile on the silicon edges of the device die.

Table 1 depicts some parameters for an example embodiment of a process.

TABLE 1

Example Process Parameters

| Molding Material | Vertical Thickness $T_4$ Range | Standoff Distance ($T_3$) Range | Stand-off Angle Range (Degrees) | Thinned Silicon Thickness | Die Size Range (μm) | Saw Blade Kerf (Narrow) | Saw Blade Kerf (Wide) |
|---|---|---|---|---|---|---|---|
| EMC | 50 to 500 μm | 0 to 200 μm | 0-10 deg | 50-400 μm | Any size | 30-50 μm | 100-400 μm |

Figure 9:
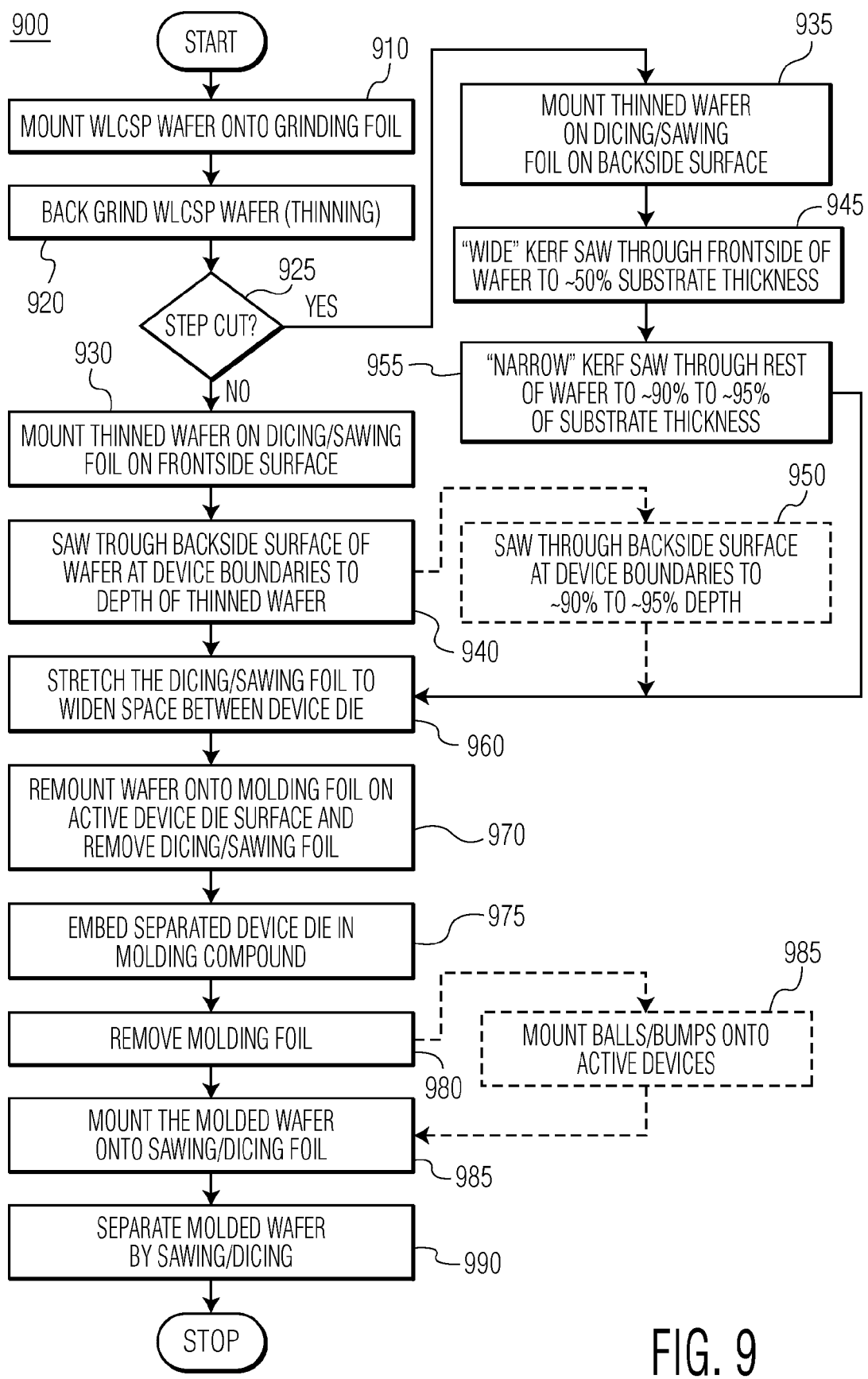
FIG. 9 is a flow diagram of an assembly process according to an embodiment of the present disclosure, the process has additional optional steps for a "step cut;"
Figure 10A:
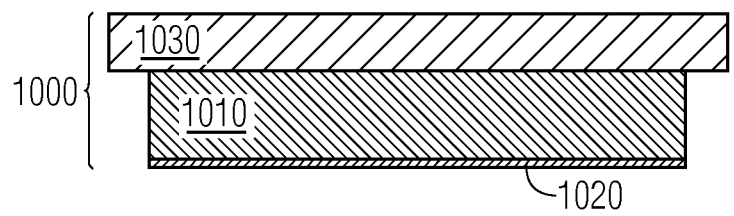
FIGS. 10A-10H illustrate an example embodiment assembled by the process of FIG. 9 with optional steps.
Figure 10B:
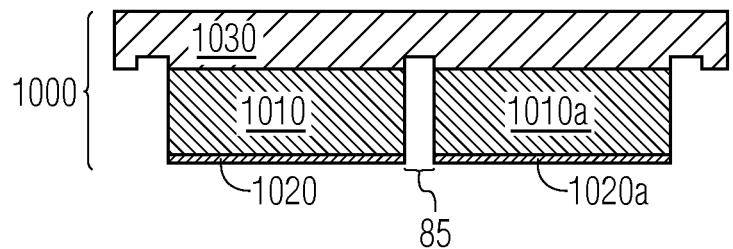
Figure 10C:
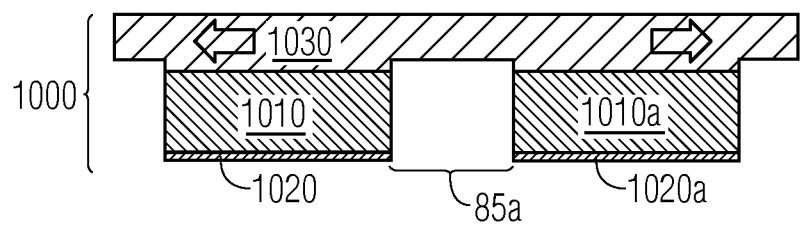
Figure 10D:
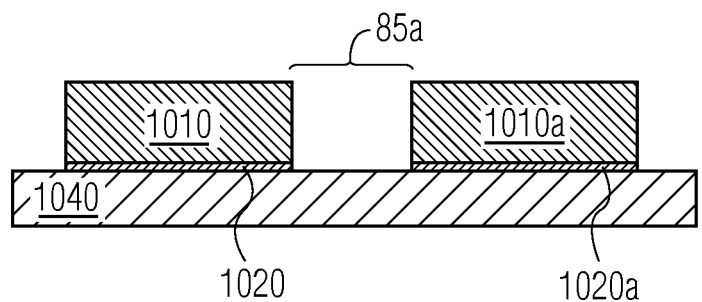
Figure 10E:
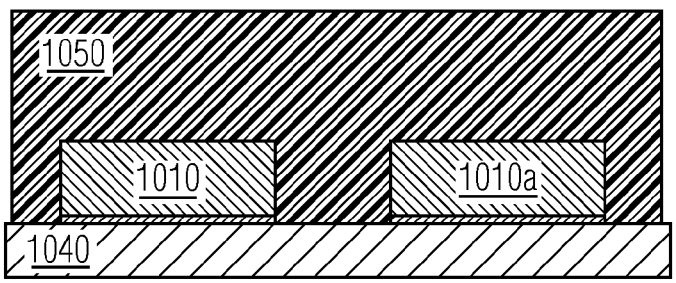
Figure 10F:
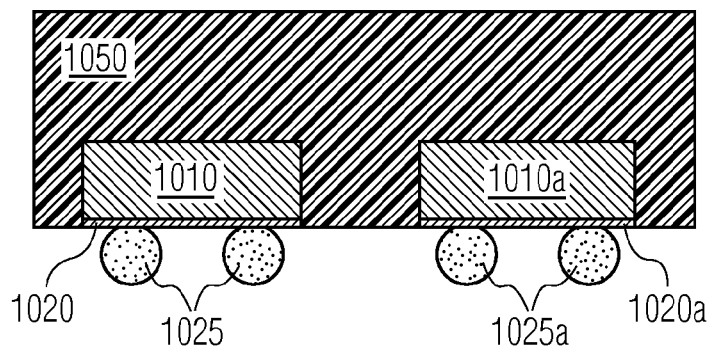
Figure 10G:
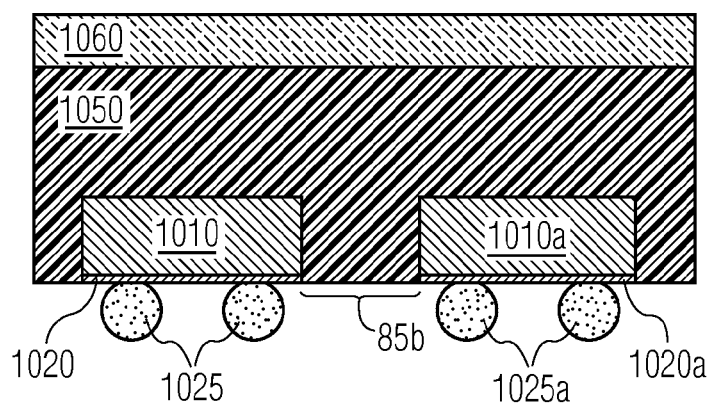
Figure 10H:
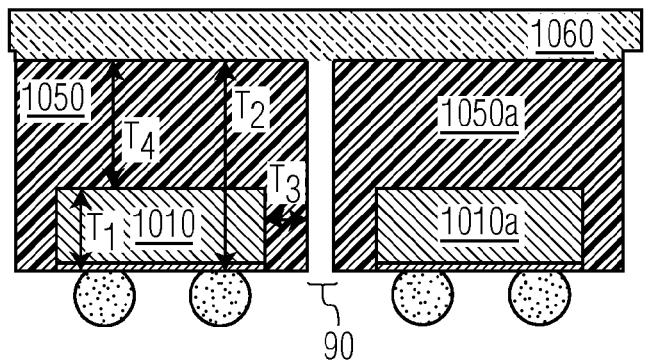

Refer to FIG. 9. In an example process, a wafer substrate is mounted, on its front-side surface, onto grinding foil 910. The wafer is thinned by back-grinding 920. On its back-side surface, the thinned wafer is mounted onto sawing/dicing foil 930. The wafer substrate is sawed through the front-side surface at the device boundaries (i.e., the saw lanes) to the depth of the thinned wafer 940. The sawing/dicing foil is stretched to widen the space between device die 960. The stretched wafer is remounted onto its front-side surface (active die surface) on a molding foil and the sawing/dicing foil is removed 970. The device die having been stretched apart, are embedded into molding compound 975. The molding compound surrounds the back-side surface and vertical faces of the device die. The molding foil is removed 980. Solder balls or bumps may be attached to active devices 980. The molded wafer is mounted onto a sawing/dicing foil 985. The now-protected devices are sawed apart and separated 990.

In a variation to the example embodiment, the wafer may be cut to a depth of about 90% to about 99% of the depth of the thinned wafer 950. In an example process the depth may be in the range of about 90% to about 95% of the depth of the thinned wafer. When the device die are stretched apart, the device die will cleave apart in the saw lanes, resulting in vertical faces having a slight projection at the back-side surface. The projection provides enhanced anchoring of the molding compound surrounding the device die.

In another variation to the example embodiment discussed with reference to FIG. 9, after the mounting of the thinned wafer on the sawing/dicing foil 920, the wafer may undergo a "step-cut" sawing process 925. The thinned wafer is mounted onto dicing/sawing foil on the back-side surface 935. A "wide" kerf saw is done through the saw lanes of the front-side of the wafer to about 50% of the thinned wafer substrate thickness 945. A "narrow" kerf saw through the rest of the wafer in the center region of the first cuts is done to a depth of about 90% to about 95% depth of the thinned wafer substrate 955. When the sawing/dicing foil is stretched 960, the remaining un-cut saw lanes cleave apart as the space between device die is widened. The process continues as discussed supra.

Refer to FIGS. 10A-10H. In cross-sectional views a wafer substrate is assembled according to the process of FIG. 9. In an assembly (FIG. 10A) apparatus 1000, a thinned wafer substrate 1010 having active devices on the front-side 1020 is attached to sawing/dicing foil 1030. A single cut (FIG. 10B) with a blade 85 of a predetermined kerf is made at the depth of the thinned wafer substrate 1010; a space about the width of the blade kerf is made. This space is widened (FIG. 10C) by about 3 times by stretching the sawing/dicing foil 1030. The stretched assembly apparatus 1000 is remounted (FIG. 10D) with the device die front-sides facing down onto temperature-resistant foil 1040. After the remounting (FIG. 10E), molding compound is flowed onto the stretched assembly apparatus 1000, encapsulating each of the device die 1010 with a molding of a thickness $T_4$. The temperature-resistant foil 1040 is removed and solder bumps 1025 are attached to die pad locations on the active devices 1020. A sawing/dicing foil 1060 is attached to the molded side of the encapsulated, stretched assembly 1000. A second blade of a kerf 95 cuts through the molding of the thickness $T_4$, so that individual device die 1010 can be separated.

Figure 11A:
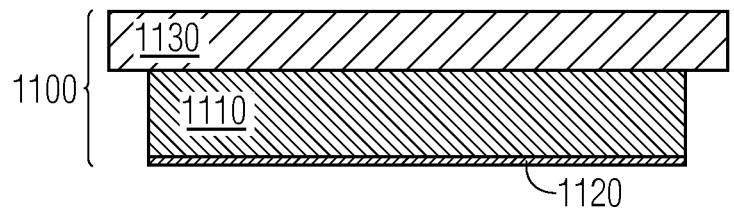
FIGS. 11A-11H illustrate an example embodiment assembled by the process of FIG. 9 without a "step cut;"
Figure 11B:
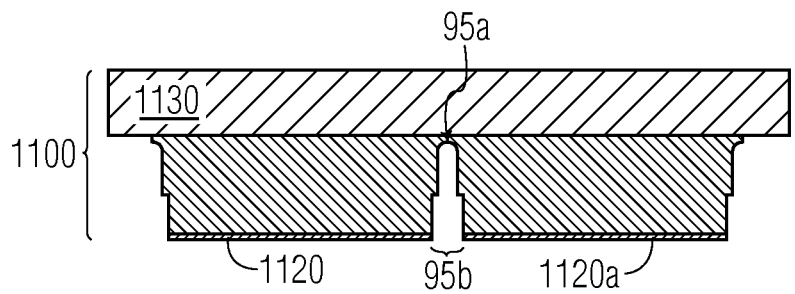
Figure 11C:
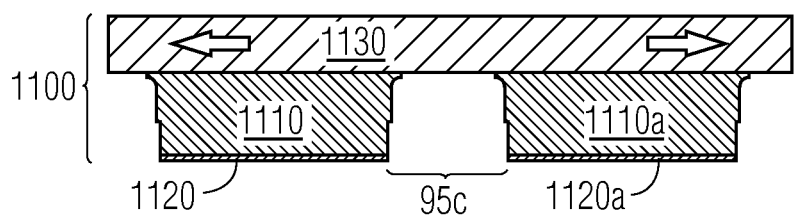
Figure 11D:
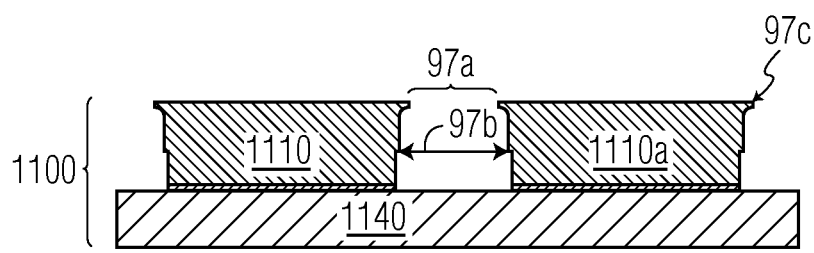
Figure 11E:
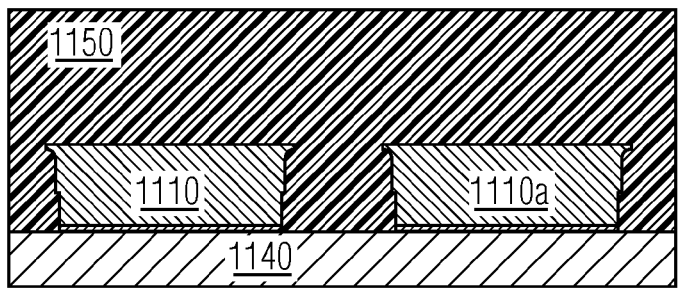
Figure 11F:
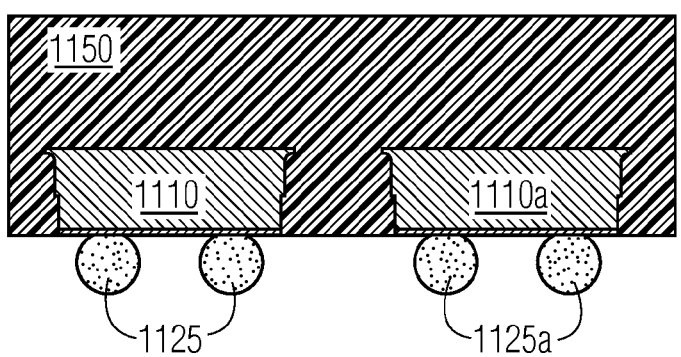
Figure 11G:
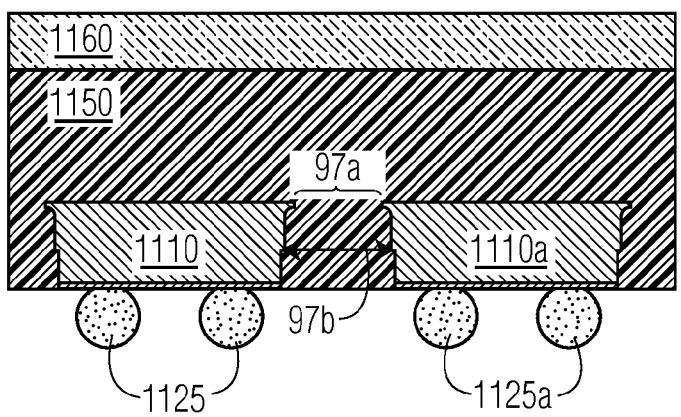
Figure 11H:
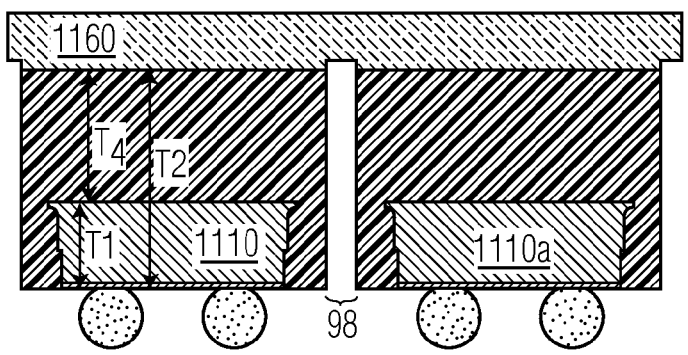

Refer to FIGS. 11A-11H. In an example embodiment, an assembly 1100 having a thinned wafer (FIG. 11A) substrate 1110 with a front side having active devices 1120 is mounted onto a sawing/dicing tape 1130. With a blade of a wide kerf 95b the wafer substrate 1110 is sawed with a first cut (to a depth of about 50% of the wafer thickness) in the saw lanes surrounding active device die boundaries. With a blade of a narrow kerf 95a, a second cut continues the first cut to a depth of about 90% to about 95% of the wafer thickness (FIG. 11B). The sawing/dicing tape 1130 is stretched and the device die, as shown by 1110 and 1110a cleave apart (FIG. 11C). The cleaved apart die 1110 and 1110a are remounted onto temperature resistant foil 1140 for subsequent molding. Note the profiles 97a, 97b, and 97c on the vertical faces of the device die 1110 and 1110a. Molding compound 1150 is flowed to encapsulate the device die 1110, 1110a (FIG. 11E). Refer to FIGS. 11F-11H. The temperature resistant foil 1140 is removed. Solder balls, solder bumps or their equivalents 1125, 1125a are applied to active device pads to provide electrical connection to the active devices 1120, 1120a. On the molded side of the assembly 1100, the sawing/dicing tape 1160 is applied. The molded device die 1110, 1110a are separated by sawing with a blade of an appropriate kerf 98.

Figure 12A:
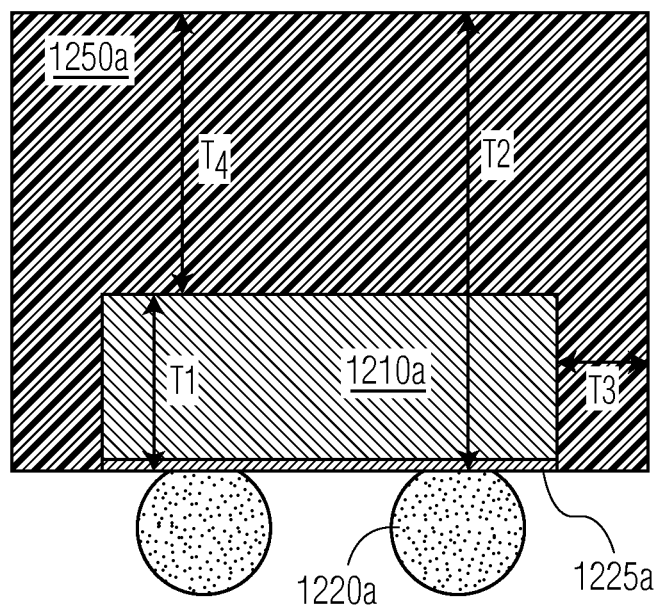
FIGS. 12A is completed device according to the process FIG. 9 without a "step cut.
Figure 12B:
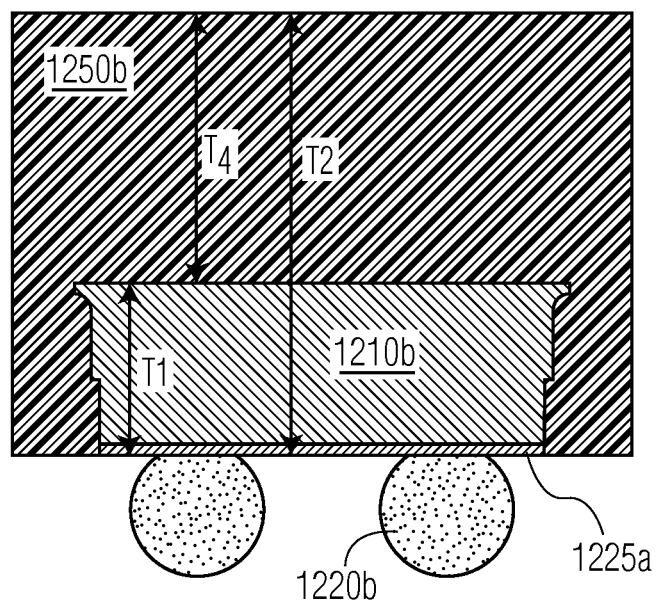
" and FIG. 12B is a completed device according to the process of FIG. 9 with a "step cut."

Refer to FIGS. 12A and 12B. Finished 1200a and 1200b are depicted, device die 1210a, 1210b having a thickness $T_1$ are encapsulated by molding compound 1250a, 1250b, of thickness $T_3$ and $T_4$. The device die 1210a, 1210b are enveloped by molding compound on the backsides and vertical faces. The fragile edges of the device die are protected from subsequent handling by the molding compound. The molding compound 1250b has additional mechanical anchoring owing to having flowed under the "broken" silicon edge 97a and the step cut 97b. The thickness $T_2$ of the molding compound and die will be determined by specific parameters or how much vertical space is available in the downstream system assembly.

In one aspect of the process of stretching, in an example process, the wafer may be stretched in an apparatus by pushing the wafer frame with the separated wafer over a ring. One example piece of apparatus is limited to expanding a 200 mm wafer to about 235 mm. The additional 35 mm (i.e., 35000 μm) appear as equally-distributed spacings between the die. With a die size of 1×1 mm², the wafer has about 200 spacings in the X and Y directions. The original kerf width on the 200 mm wafer is about 20μ-25 μm created by the dicing blade. Expansion by 35 mm will increase the kerf spacing by about 175 um; the final kerf width after expansion is about 195 μm to about 200 μm.

The embodiments discussed, protect both the backside and vertical faces of the WLCSP device against mechanical impacts from subsequent handling during assembly (i.e., tweezers, pipettes, vacuum wands, etc.). The thickness of the material $T_4$ and the $T_3$ standoff distance determine the degree of protection.

Numerous other embodiments of the invention will be apparent to persons skilled in the art without departing from the spirit and scope of the invention as defined in the appended claims.

The invention claimed is:

1. A method for assembling a wafer level chip scale processed (WLCSP) wafer, the wafer having a front-side surface and a back-side surface, a plurality of device die having electrical contacts on the front-side surface, the method comprising:
    back-grinding, to a thickness, the back-side surface the wafer;
    applying a protective layer of a thickness onto the back-side surface of the wafer;
    mounting the WLCSP wafer onto a sawing foil onto the back-side surface having the protective layer;
    sawing the WLCSP wafer in saw lanes of the plurality of device die on the front-side surface, the sawing occurring with a blade of a first kerf and to a first depth of the back-ground wafer thickness;
    again sawing the WLCSP along the saw lanes of the plurality of device die, the sawing occurring with a blade of a second kerf, the second kerf narrower than the first kerf, and sawing to a depth of the thickness of the protective layer;
    separating the plurality of device die into individual device die;
    wherein each individual device die has a protective layer on the back-side, the protective layer having a stand-off distance from a vertical edge of the individual device die.

2. The method as recited in claim 1, wherein after back-grinding the backside surface of the wafer, the method further comprises,
    half-cut sawing on the back-side surface of the wafer in regions corresponding to saw lanes of the plurality of device die.

3. The method as recited in claim 1, wherein the applying of the protective layer includes an intermediate step of applying a laminating glue onto the back-side of the wafer so as to provide adhesion to the protective layer.

4. The method as recited in claim 1, wherein after the applying of the protective layer, the method further comprises attaching solder bumps to the electrical contacts on the front-side surface of the wafer.

5. The method as recited in claim 1, wherein the stand-off distance is a function of a side impact angle and the back-ground thickness of the wafer.

6. The method as recited in claim 1, wherein the protection material is at least one of the following: flexible plastic.

7. The method as recited in claim 6,
    wherein the flexible plastic is selected from at least one of the following: poly-oxydiphenylene-pyromellitimide, polytetrafluoroethylene, molding compound, film on wire (FOW).

8. The method as recited in claim 3, wherein the protective material is at least one of the following: adhesive, composite material, metal, ceramic, glass.

9. The method as recited in claim 6, wherein the thickness of the wafer and the thickness of the protection material are determined by the type of protection material used.

10. A method for assembling a wafer level chip scale processed (WLCSP) wafer, the wafer having a front-side surface and a back-side surface, a plurality of device die having electrical contacts on the front-side surface, the method comprising:
    mounting the wafer onto a grinding foil;
    back-grinding, to a thickness, the back-side surface the wafer;
    performing a half-cut sawing on the back-side surface of the wafer in areas corresponding to saw lanes of the plurality of device die, forming slots surrounding each one of the plurality of device die, the slots having a width of the half-cut blade kerf and a depth of about 50% of the thickness of the back-ground wafer;
    molding a protective layer of a thickness onto the back-side of wafer, the protective layer filling in the slots and covering the back-side surface;
    mounting the WLCSP wafer on its back-side surface, onto a sawing foil;
    sawing the WLCSP wafer on the front-side surface in saw lanes of the plurality of device die, the sawing occurring with a blade of a first kerf and to at least a first depth of the back-ground wafer, the first kerf less than that of the half-cut blade kerf;
    again sawing the WLCSP on the front-side surface in the saw lanes of the plurality of device die, the sawing occurring with a blade of a second kerf, the second kerf narrower than the first kerf, and sawing to a depth of at least the thickness of the protective layer;
    separating the plurality of device die into individual device die; and
    wherein, each individual device die has a protective layer on the back-side, the vertical edges having recesses formed from the slots, the protective layer filling the recesses flush with the vertical edges; and
    wherein, the protective layer has a stand-off distance from vertical edges of the individual device die.

11. The method as recited in claim 10, wherein the protective layer is a plastic selected from at least one of the following: poly-oxydiphenylene-pyromellitimide, polytetrafluoroethylene, molding compound.

12. A method for assembling a wafer level chip scale processed (WLCSP) wafer, the wafer having a front-side surface and a back-side surface, a plurality of device die having electrical contacts on the front-side surface, the method comprising:
    mounting the wafer onto a grinding foil;
    back-grinding, to a thickness, the back-side surface the wafer;
    performing a half-cut sawing on the back-side surface of the wafer in areas corresponding to saw lanes of the plurality of device die, forming slots surrounding each one of the plurality of device die, the slots having a width of the half-cut blade kerf and a depth of about 50% of the thickness of the back-ground wafer;
    molding a protective layer of a thickness onto the back-side surface of wafer, the protective layer filling in the slots and covering the back-side surface;
    mounting the WLCSP wafer on its back-side surface, onto a sawing foil;
    sawing the WLCSP wafer on the front-side surface in saw lanes of the plurality of device die, the sawing occurring with a blade of a first kerf and to at least a total depth of the back-ground wafer and thickness of the protective layer, the first kerf less than that of the halfcut blade kerf;
    stretching the sawing foil and separating the plurality of device die into individual device die; and
    wherein, each individual device die has a protective layer on the back-side, the vertical edges having recesses formed from the slots, the protective layer filling the recesses flush with the vertical edges; and wherein, the protective layer is about flush with the vertical edges of the individual device die.

13. The method as recited in claim 12, further comprising, after mounting the wafer on its back-side surface, attaching solder balls to the electrical contacts on the front-side surface of the wafer.

14. The method as recited in claim 13, wherein the protective layer is selected from at least one of the following: at least one of the following: poly-oxydiphenylene-pyromellitimide, polytetrafluoroethylene, molding compound, film on wire (FOW).

15. The method as recited in claim 14, wherein, the thickness of the protective layer on the back-side surface at least 100 μm.

* * * * *